US006903936B2

(12) United States Patent
Lin

(10) Patent No.: US 6,903,936 B2
(45) Date of Patent: Jun. 7, 2005

(54) POWER REGULATOR

(76) Inventor: Saul Lin, No. 21, Jentzu 7 St., Jenwu Hsiang, Kaohsiung Hsien (TW)

( * ) Notice: Subject to any disclaimer, the term of this patent is extended or adjusted under 35 U.S.C. 154(b) by 30 days.

(21) Appl. No.: 10/693,940

(22) Filed: Oct. 28, 2003

(65) Prior Publication Data

US 2005/0088831 A1 Apr. 28, 2005

(51) Int. Cl.$^7$ .............................. H05K 7/14; H05K 7/20
(52) U.S. Cl. ...................... 361/752; 361/697; 361/709; 361/720
(58) Field of Search ............................. 361/697, 702, 361/704, 709, 711, 714, 715, 716, 719, 720, 361/728, 729, 730, 752, 748, 760, 796; 174/50, 174/52.1; 257/678

(56) References Cited

U.S. PATENT DOCUMENTS

| | | | | |
|---|---|---|---|---|
| 3,952,142 A | * | 4/1976 | Weiss | 174/52.1 |
| 4,872,102 A | * | 10/1989 | Getter | 363/141 |
| 5,170,336 A | * | 12/1992 | Getter et al. | 363/141 |
| 5,297,025 A | * | 3/1994 | Shoquist et al. | 361/704 |
| 5,808,869 A | * | 9/1998 | Donahoe et al. | 361/704 |
| 5,842,514 A | * | 12/1998 | Zapach et al. | 165/104.33 |
| 6,778,388 B1 | * | 8/2004 | Minelli | 361/690 |

* cited by examiner

Primary Examiner—Randy W. Gibson
Assistant Examiner—Dameon E. Levi
(74) Attorney, Agent, or Firm—Bacon & Thomas PLLC

(57) ABSTRACT

A power regulator has a heat sink, a case and a PCB. The case is mounted on a top of the heat sink, and multiple holes are defined in the case. The PCB is mounted vertically on top of the heat sink and has a fuse bracket, a wire connector, an input terminal, an output terminal and a circuit including a fuse in the fuse bracket, transformer, power transistors, etc. The fuse bracket, wire connector and the input and output terminals are aligned with corresponding holes in the case so a person can replace the fuse and connect or disconnect wires without removing the PCB from the case. Further, the PCB is thin and mounted vertically on top of the heat sink, so the heat sink and the case can be formed in an upright rectangular shape. Consequently, a power control box using the power regulator requires less space.

9 Claims, 7 Drawing Sheets

POWER REGULATOR

BACKGROUND OF THE INVENTION

1. Field of the Invention

The present invention relates to a power regulator, and more specifically to a power regulator that is upright and has a fuse so a power control box using the power regulator requires less space.

2. Description of Related Art

A power control box is usually used in electrical equipment and has numerous devices such as a main controller, a circuit breaker, a power controller, relays, a fuse, a power regulator, etc.

When power regulators operate, heat is produced so power regulators usually have a heat sink.

With reference to FIGS. 6 and 7, conventional power regulators (60, 60') are directly connected to or mounted on a heat sink (70, 70'). When a conventional power regulator (60') is directly mounted on a heat sink (70'), the power regulator (60') is composed of a casing (61) and a printed circuit board (PCB) (62). The PCB (62) is mounted horizontally in the casing (61) and has a power transistor (621). The power transistor (621) produces very much heat, so the power transistor (621) has a heat-conduction plate (622). The heat-conduction plate (622) is attached to the casing (61) and the heat sink (70') by a screw (623). Consequently, the heat from the power transistor (622) can pass to the heat sink (70') through the heat-conduction plate (622) and the screw (623).

Most electrical devices do not use the same size power control box, and the power control box in newer electrical equipment trends to be smaller than the power control box in older electrical equipment. Therefore, reducing the footprint of the power control box is not only desirable for newer electrical equipment but is an absolute necessity in many cases. However, the PCB mounted horizontally in the casing of a conventional power regulator is a minimum limitation to the size of the footprint of the power control box.

The present invention provides a narrower power regulator to mitigate or obviate the aforementioned problems.

SUMMARY OF THE INVENTION

An objective of the present invention is to provide a power regulator that has a narrow footprint.

Another objective of the present invention is to provide an internal fuse so the power control box does not have to have an external fuse.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
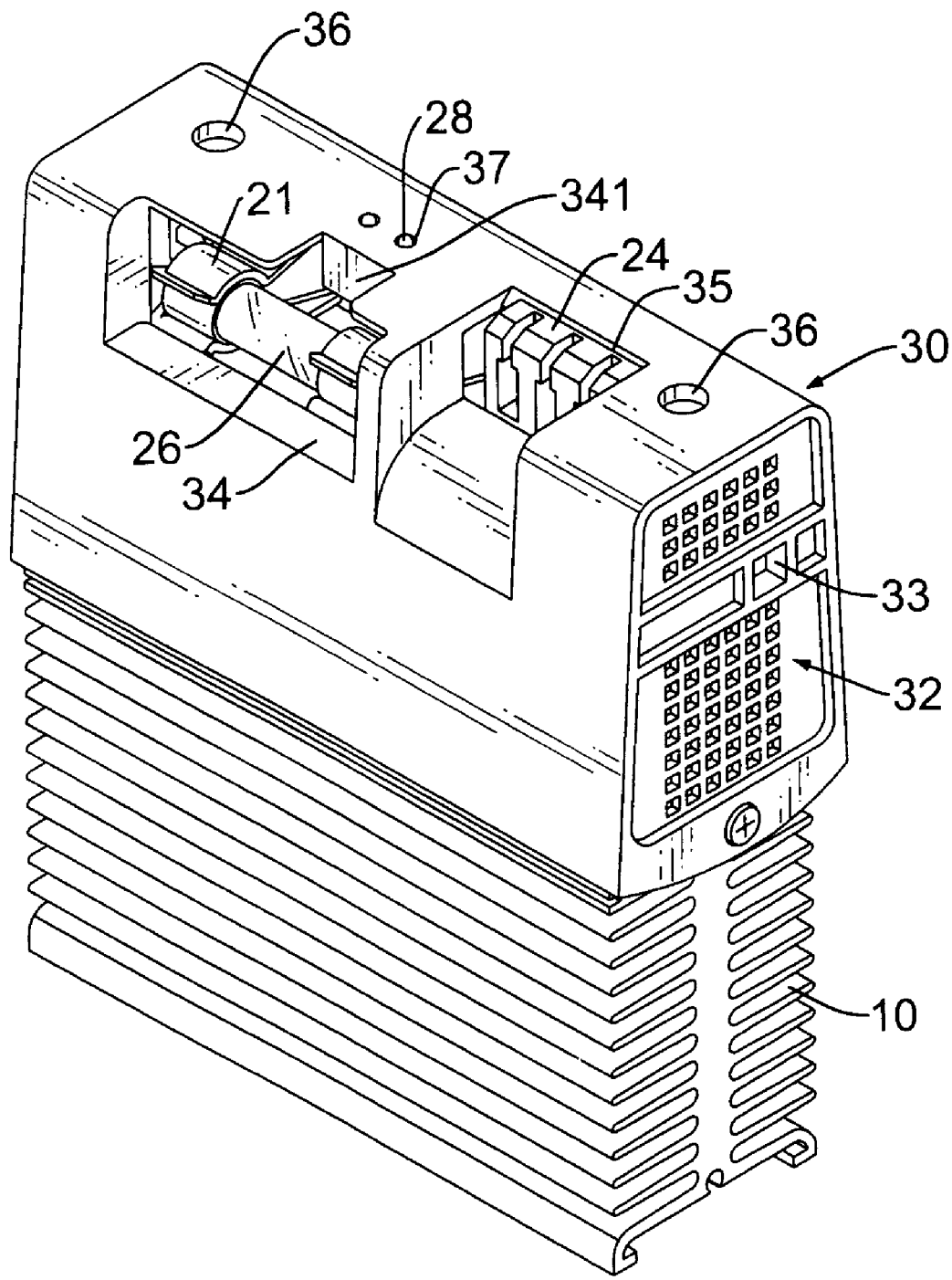
FIG. 1 is a perspective view of a power regulator in accordance with the present invention.
Figure 2:
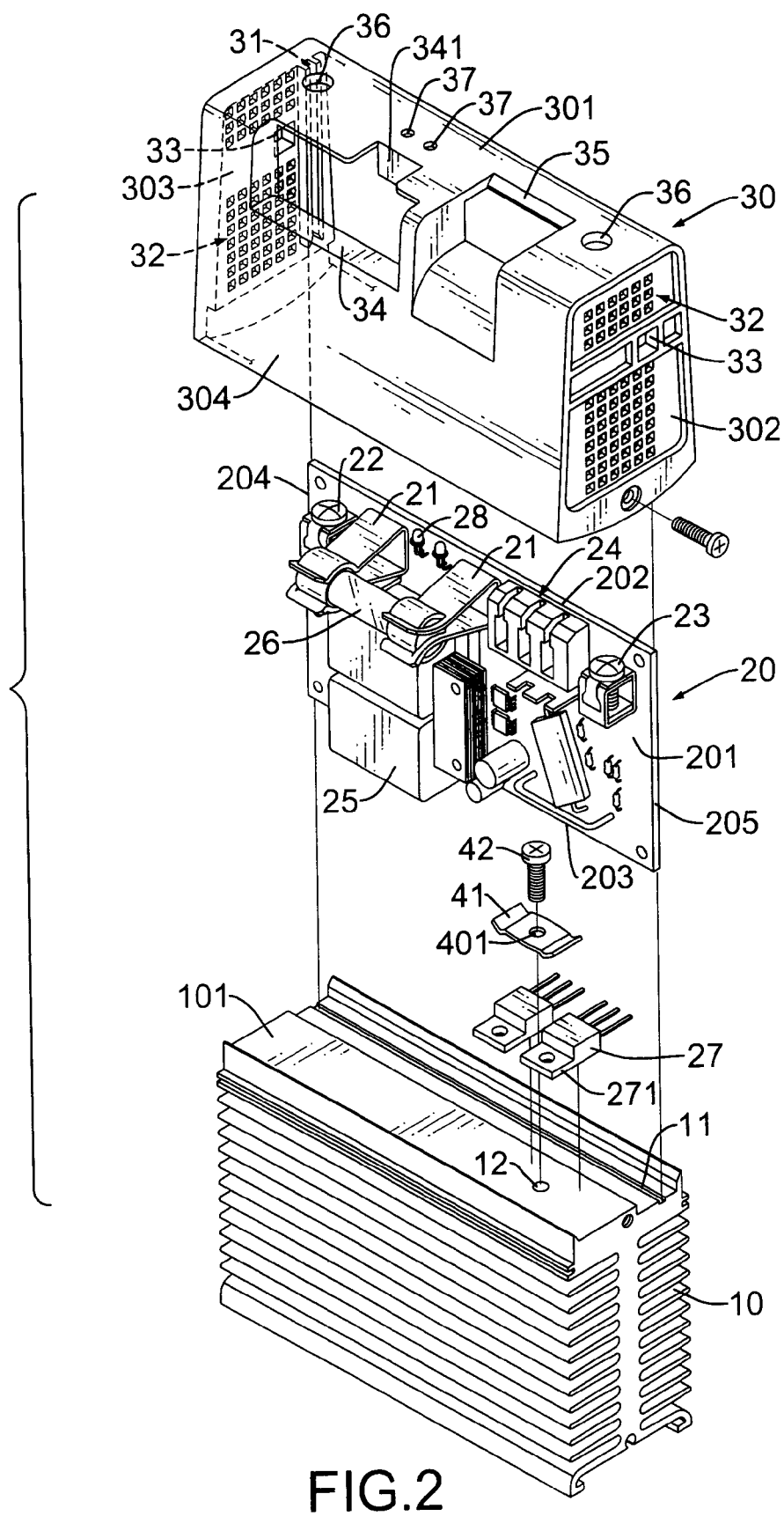
FIG. 2 is an exploded perspective view of the power regulator in FIG. 1.

With reference to FIGS. 1 and 2, a power regulator in accordance with the present invention includes a heat sink (10), a case (30) and a printed circuit board (PCB) (20).

The heat sink (10) is an upright rectangular cuboid and has a top (101), a longitudinal central wall (not numbered), multiple fins (not numbered) and a bottom (not numbered). The top (101) is rectangular and has a front edge (not numbered), a rear edge (not numbered), a left side edge (not numbered), a right side edge (not numbered), a top surface (not numbered) and a bottom (not numbered). The top surface has a longitudinal PCB slot (11), a longitudinal recess (not numbered) and at least one threaded hole (12). The left and right side edges have at least one connector element (not numbered) in each edge. The connector elements may be threaded holes (not numbered), protruding ridges (not shown), protruding lips (not shown), detents (not shown) or the like.

The case (30) has a top face (301), a front face (304), a rear face (not shown), a right side (302), a left side (303), an open bottom (not numbered), a fuse access hole (34), a wire connector access hole (35), a case connector element (not numbered) and an inside chamber (not numbered) and is mounted on the top (101) of the heat sink (10).

The top face (301) is rectangular and has a front edge (not numbered), a rear edge (not numbered), a left side edge (not numbered), a right side edge (not numbered), indicating holes (37) and two terminal access holes (36). The terminal access holes (36) are formed near the rear edge and respectively near the left and right side edges.

The front face (304) is rectangular and has a top edge (not numbered), a left edge (not numbered), a right edge (not numbered) and a bottom edge (not numbered). The top edge of the front face (304) is integrally formed with the front edge of the top face (301).

The fuse access hole (34) is formed through the front face (304) and the top face (301) and has a top recess (341). The fuse access hole (34) is formed between the terminal access holes (36) toward the left side edges of the top face (304) and the front face (301). The top recess (341) can be a rectangular shape or a circular shape.

The wire connector access hole (35) is formed through the front face (304) and the top face (301) between the terminal access holes (36) toward the right side edges of the top face (304) and the front face (301).

The rear face is rectangular and has a top edge (not shown), a left side 19 edge (not shown), a right side edge (not shown) and a bottom edge (not shown) The top edge is integrally formed with the rear edge of the top face (301).

The right side (302) and the left side (303) are slightly trapezoidal or rectangular, are elongated vertically and are mirror images of each other. Each side (302, 303) has a top edge (not numbered), a bottom edge (not numbered), a front edge (not numbered), a rear edge (not numbered), multiple heat-dissipating holes (32), at least one wire hole (33), an outside surface (not numbered), an inside surface (not numbered) and a vertical PCB slot (31). The wire hole (33) is formed near the rear edge and toward the top edge. The inside surface has a shoulder (not numbered). The shoulder is formed near the bottom edge and corresponds to the left or right end of the top of the heat sink (10). The vertical PCB slots (31) are formed respectively on the inside surfaces of the right and left sides (302, 303) and align with the longitudinal PCB slot (11) in the top (101) of the heat sink (10).

The case connector elements are formed near the bottom edges of the right and left sides (302, 303), correspond to the connector elements on the heat sink (10) and may be holes and screws, interlocking ribs, hooks, clamps or the like. The case connector elements securely attach the case (30) to the heat sink (10).

Figure 3:
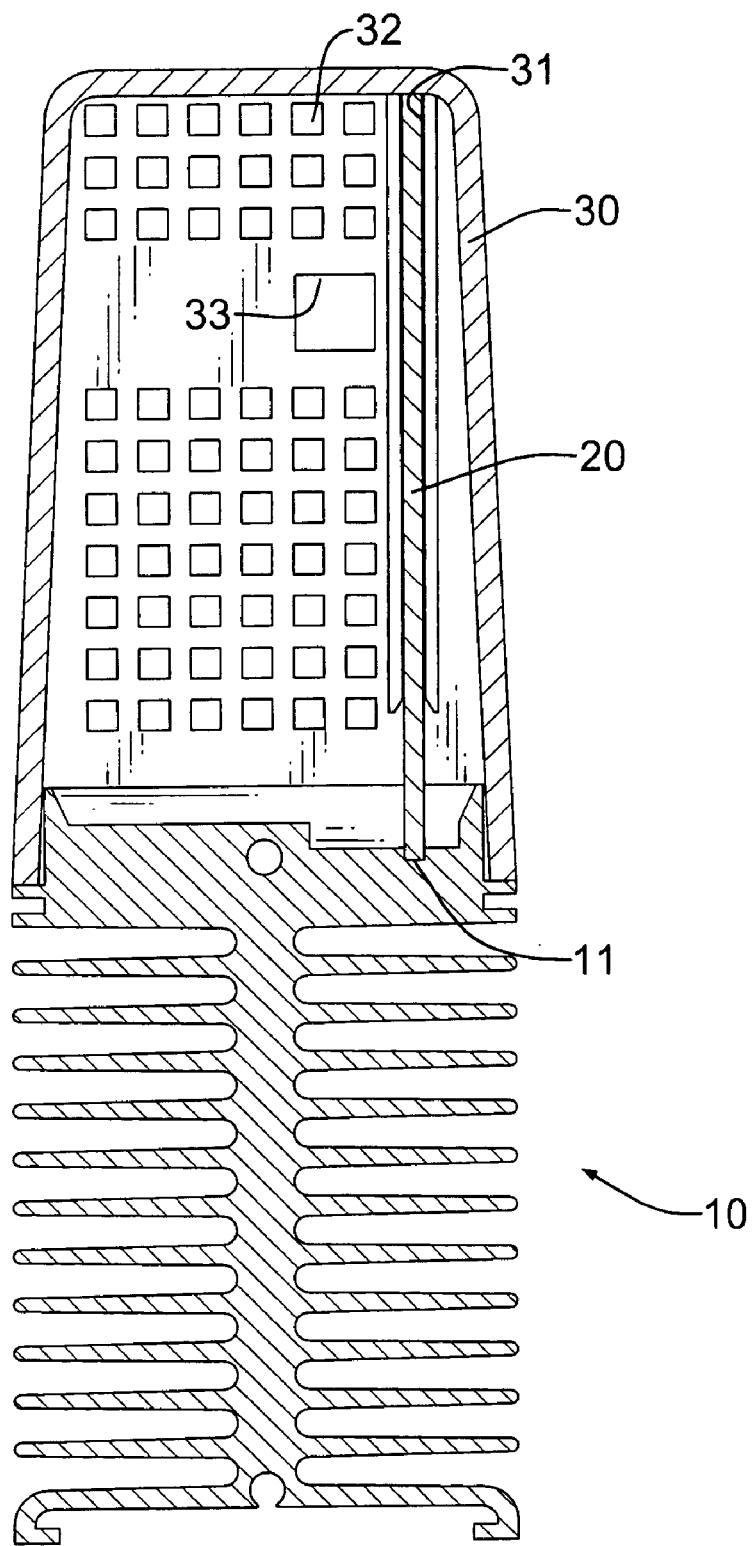
FIG. 3 is a cross sectional right side plan view of the power regulator in FIG. 1.

With further reference to FIG. 3, the PCB (20) is thin and is mounted vertically in the vertical slots (31) in the right and left sides (302, 303) of the case (30) and the longitudinal PCB slot (11) in the top (101) of the heat sink (10). Consequently, the case (30) has a narrow elongated footprint (not shown), and the heat sink (10) has a shape corresponding to the footprint of the case (30).

Figure 4:
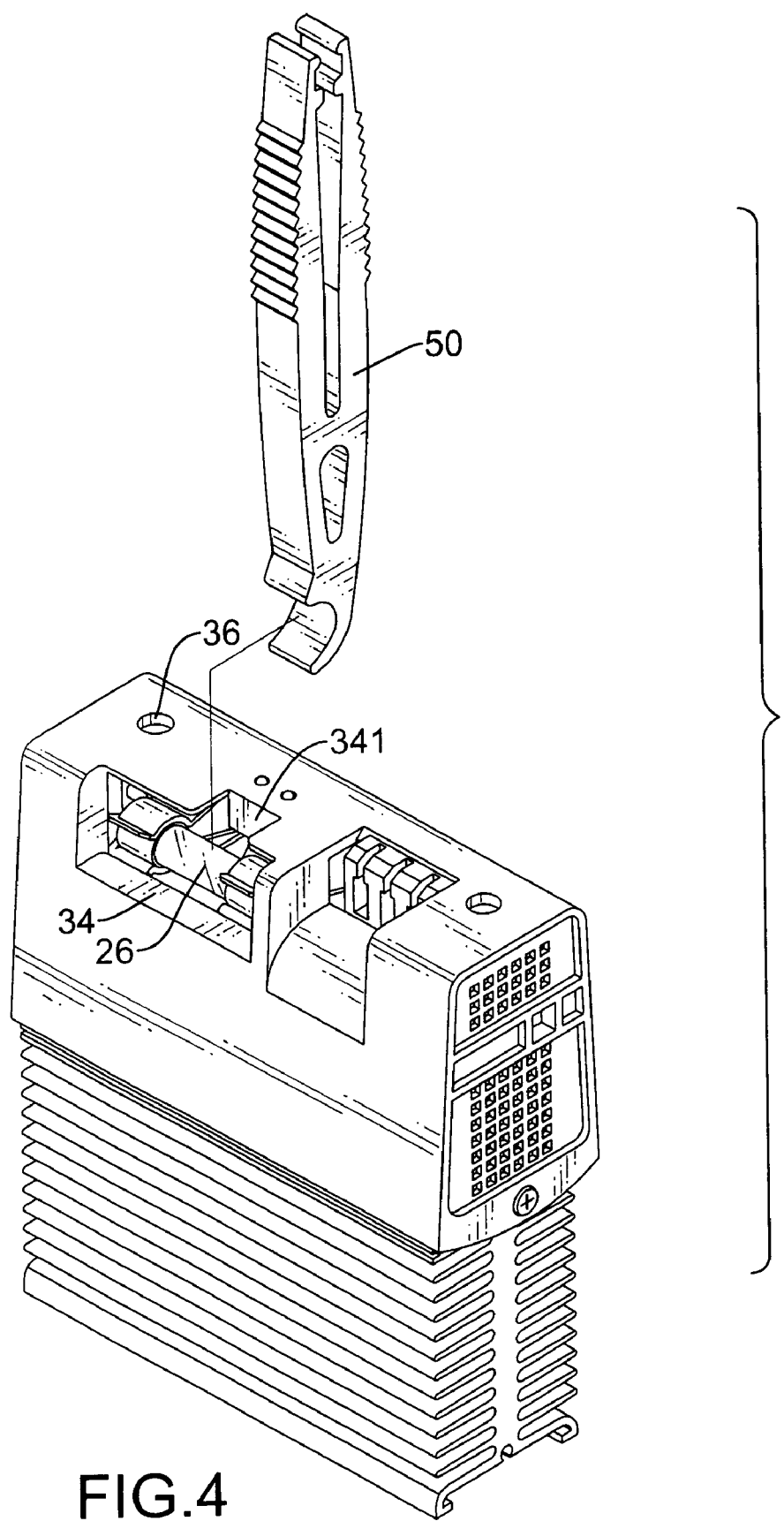
FIG. 4 is an operational perspective view of the power regulator in FIG. 1 with the fuse being removed.

The PCB (20) has a front face (201), a top edge (202), a bottom edge (203), a left side edge (204), a right side edge (205), a circuit (not numbered), a fuse bracket (21), a power input terminal (22), a power output terminal (23) and a wire connector (24). The fuse bracket (21), the power input and output terminals (22, 23) and the wire connector (24) are mounted on the front face (201) close to the top edge (202) of the PCB (20). The input and output terminals (22, 23) are respectively close to opposite side edges (204, 205), correspond to the wire holes (33) in the right and left side (302, 303) of the case (30) and align respectively with the terminal access holes (36) in the top face (301) of the case (30). The circuit formed on the front face (201) includes a transformer (25), a fuse (26), power transistors (27) and indicators (28). The fuse bracket (21) is mounted on the front face (201) and corresponds to the fuse access hole (34) in the front and top faces (304, 301) of the case (10). With further reference to FIG. 4, the fuse (26) is mounted in or removed from the fuse bracket (21) with a fuse puller (50). The power transistors (27) are mounted on the front face (201) close to the bottom edge (203) and are separated by a gap (not numbered). Each power transistor (27) has a metal heat-conduction plate (271) that faces the heat sink (10) and abut the heat sink (10) when the heat sink (10) is mounted in the PCB slots (11, 31) and the case (30) is attached to the heat sink (10). The indicators (28) are mounted on the front face (201) close to the top edge (202) and correspond to the indicator holes in the top face (301) of the case (30).

The power regulator can optionally include a PCB clamp (not numbered) that is composed of a clamp (41) with a through hole (401) and a screw (42). The top (101) of the heat sink (10) further has a threaded hole (12) corresponding to the gap between the two power transistors (27). The clamp (41) is placed on the two power transistors (27), and the screw (42) is passed through the through hole (401) and screwed into the threaded hole (12) in the top (11) of the heat sink. Thereby, the two power transistors (27) are securely attached to the top (11) of the heat sink (10).

With reference to FIG. 4, the fuse (26) on the fuse bracket (21) is exposed through the fuse access hole (34) in the case (30) so the fuse (26) can be easily replaced by a fuse puller (50).

Figure 5:
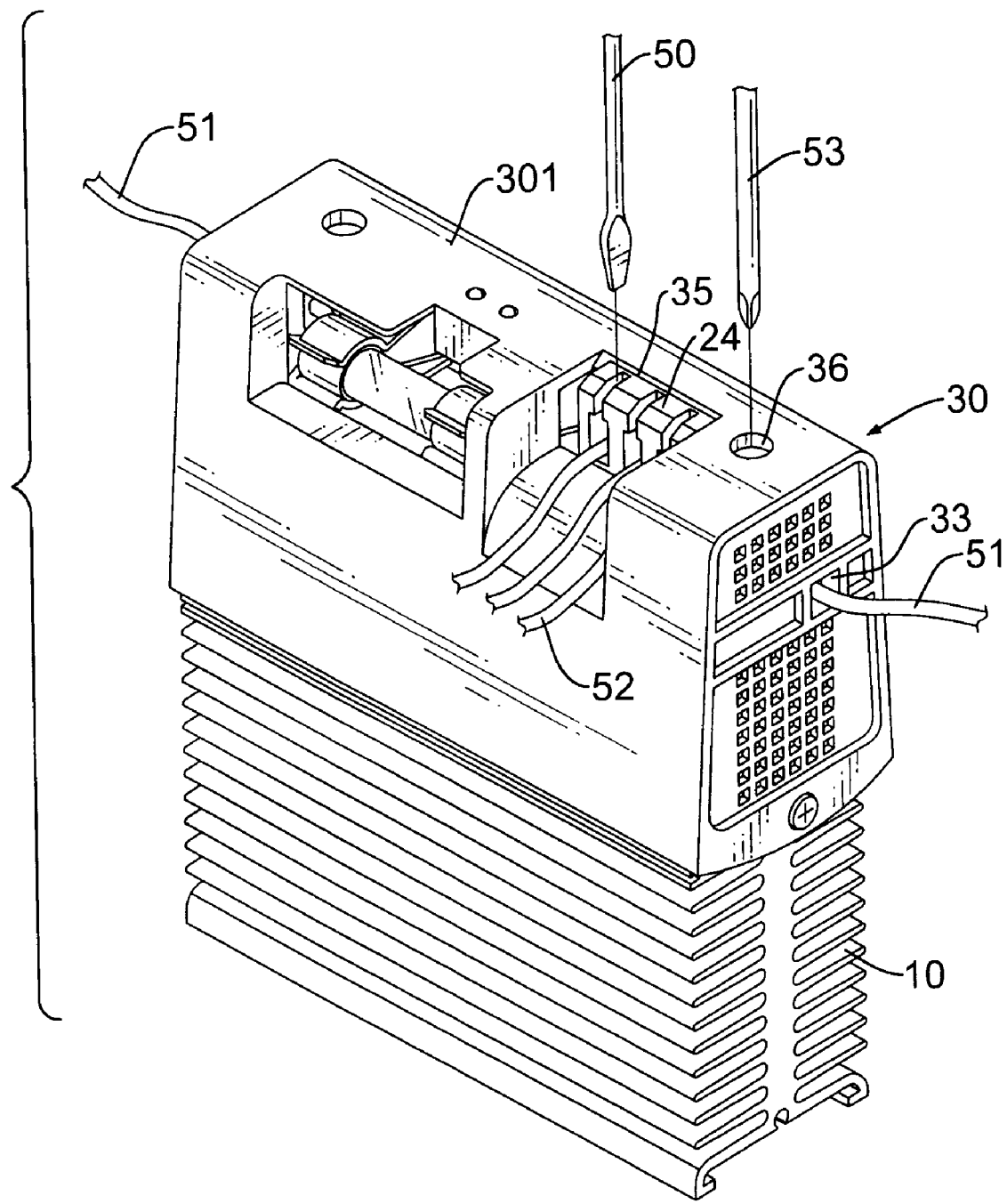
FIG. 5 is an operational perspective view of the power regulator in FIG. 1 with a wire being connected.
Figure 6:
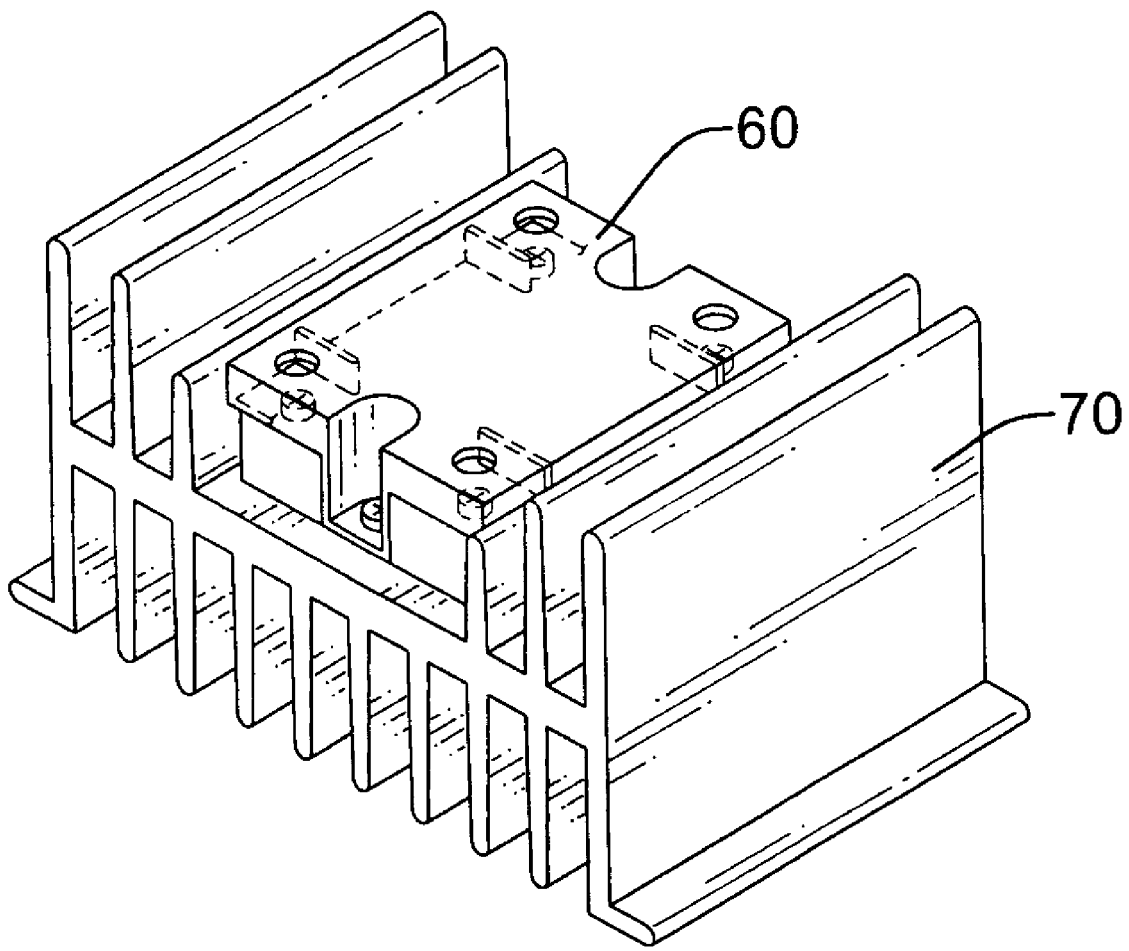
FIG. 6 is a perspective view of a conventional power regulator in accordance with the prior art.
Figure 7:
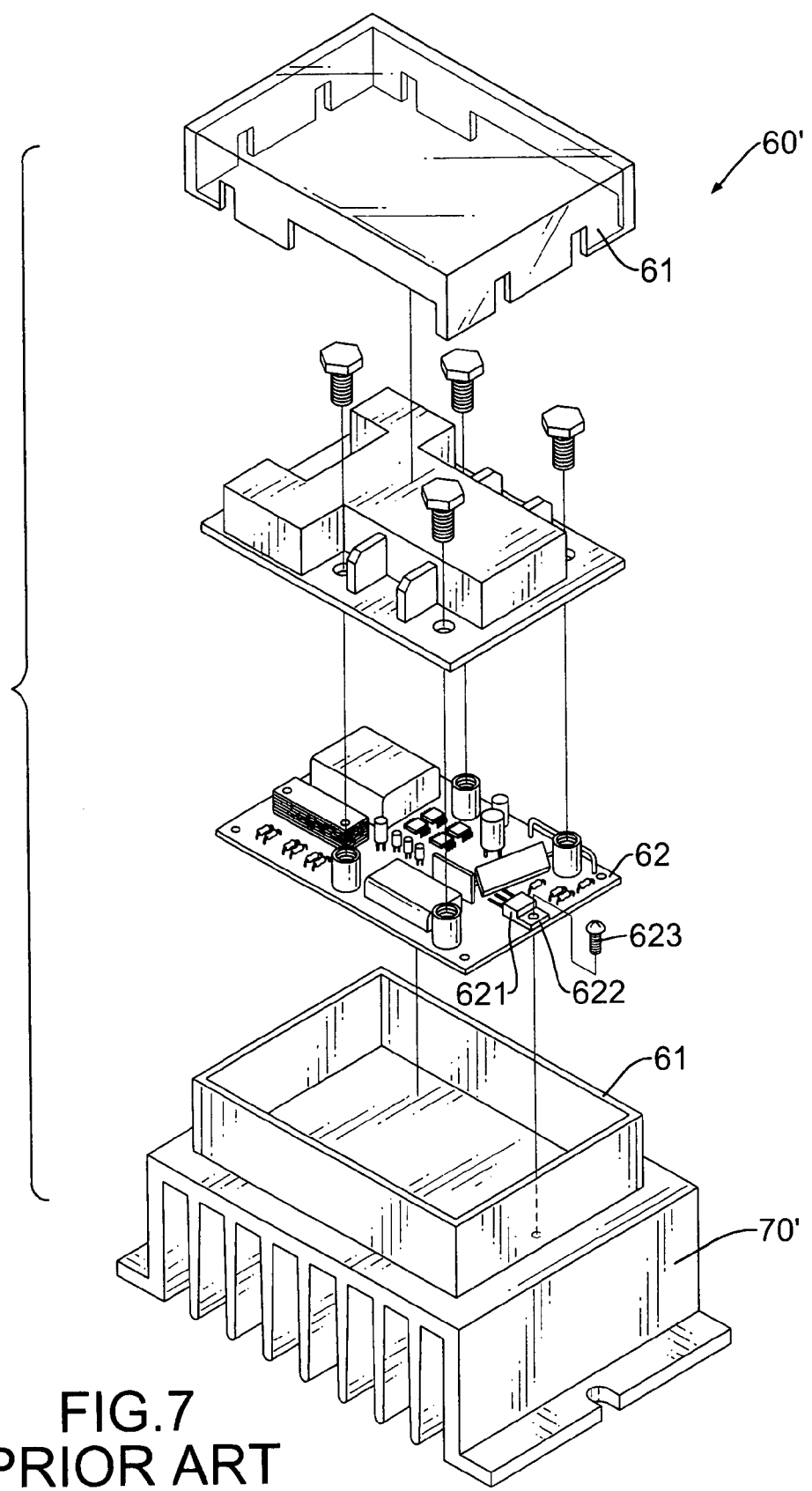
FIG. 7 is an exploded perspective view of another embodiment of a conventional power regulator in accordance with the prior art.

With further reference to FIG. 5, two power wires (51) are passed respectively through the two wire holes (33) and connected to the power input and output terminals. A person can insert a screwdriver (53) through the terminal access holes (36) and attach power wires (51) to or disconnect power wires (51) from the power input and output terminals (22, 23). The wire connector (24) is accessible through the wire connector access hole (35) in the front and top face (304, 301) of the case (30) so a person can easily connect signal wires (52) to the wire connector (24).

As mentioned above, the PCB (20) is mounted vertically on the heat sink (10) so the power regulator is tall and narrow. Therefore, the power regulator having the thin case and the heat sink can be mounted in a small power control box. In addition, the power regulator has a fuse bracket to hold a fuse so the power control box does not need an external fuse. That is, more space is available in the power control box. Further, the case has holes corresponding to the power input and output terminals, fuse and wire connector, etc. so a person can easily connect power wires and change the fuse without removing the PCB from the case.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A power regulator, comprising:
    an upright heat sink having a top;
    a case mounted on the top of the upright heat sink and having multiple holes including a fuse access hole, a wire connector access hole and two terminal holes; and
    a printed circuit board (PCB) mounted in the case and mounted vertically on the top; wherein the PCB has a fuse bracket aligned with the fuse access hole, a wire connector aligned with the wire connector access hole, an input terminal and an output terminal aligned respectively with the two terminal holes and a circuit comprising a fuse mounted in the fuse bracket, a transformer and two power transistors.

2. The power regulator as claimed in claim 1, wherein a longitudinal PCB slot is defined in the top and the PCB is mounted vertically in the longitudinal PCB slot.

3. The power regulator as claimed in claim 1, wherein the case is formed with a slightly rectangular shape and has a front face, a top face and two opposite sides that have inner faces on which vertical PCB slots are respectively formed opposite to each other, wherein the PCB is mounted in the two vertical PCB slots.

4. The power regulator as claimed in claim 3, wherein a top recess is defined in the top face and communicates with the fuse access hole on the front face.

5. The power regulator as claimed in claim 3, wherein multiple heat dissipating holes are defined in each side.

6. The power regulator as claimed in claim 1, wherein at least one indicating hole is defined in the top face and the circuit further has at least one indictor aligned with the indicating hole.

7. The power regulator as claimed in claim 1, further comprising
    a threaded hole defined on the top of the heat sink, wherein the threaded hole corresponds to a gap between the two power transistors; and
    a PCB clamp composed of a clamp with a through hole and a screw and placed on the two power transistors and screwed into the threaded hole in the top of the heat sink.

8. The power regulator as claimed in claim 1, further comprising two wire holes defined respectively in one of the two opposite sides and aligned with the input and output terminals.

9. The power regulator as claimed in claim 1, further comprising two wire holes defined respectively in the two opposite sides and aligned with the input and output terminals.

* * * * *